United States Patent
Horikawa et al.

(10) Patent No.: US 10,354,796 B2
(45) Date of Patent: Jul. 16, 2019

(54) METHOD FOR MANUFACTURING PLANAR COIL

(71) Applicant: TDK Corporation, Tokyo (JP)

(72) Inventors: Yuhei Horikawa, Tokyo (JP); Makoto Orikasa, Tokyo (JP); Yoshihiro Kanbayashi, Tokyo (JP); Hisayuki Abe, Tokyo (JP); Hirohumi Asou, Tokyo (JP); Kosuke Kunitsuka, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/840,243

(22) Filed: Dec. 13, 2017

(65) Prior Publication Data

US 2018/0174748 A1    Jun. 21, 2018

(51) Int. Cl.

| | |
|---|---|
| *H01F 41/04* | (2006.01) |
| *H01F 41/10* | (2006.01) |
| *C25D 13/22* | (2006.01) |
| *C23C 18/16* | (2006.01) |
| *C25D 13/12* | (2006.01) |

(Continued)

(52) U.S. Cl.
CPC ....... *H01F 41/043* (2013.01); *C23C 18/1607* (2013.01); *C23C 18/1641* (2013.01); *C23C 18/1653* (2013.01); *C25D 5/48* (2013.01); *C25D 13/12* (2013.01); *C25D 13/22* (2013.01); *G06K 19/07783* (2013.01); *H01F 41/04* (2013.01); *H01F 41/041* (2013.01); *H01F 41/045* (2013.01); *H01F 41/10* (2013.01); *H01Q 1/36* (2013.01); *H01Q 1/38* (2013.01); *H01Q 1/48* (2013.01); *H01Q 7/00* (2013.01); *H01Q 9/27* (2013.01); *H05K 3/181* (2013.01);

(Continued)

(58) Field of Classification Search
None
See application file for complete search history.

(56) References Cited

U.S. PATENT DOCUMENTS

| 6,476,775 | B1 | 11/2002 | Oberle | |
|---|---|---|---|---|
| 7,675,464 | B2 * | 3/2010 | Cleeves | ................ H01L 23/66 343/700 MS |

(Continued)

FOREIGN PATENT DOCUMENTS

| JP | 2009-246363 A | 10/2009 |
|---|---|---|
| JP | 2010-168413 A | 8/2010 |
| JP | 2012104673 A | 5/2012 |

*Primary Examiner* — Jiong-Ping Lu
(74) *Attorney, Agent, or Firm* — Young Law Firm, P.C.

(57) ABSTRACT

Disclosed herein is a method for manufacturing a planar coil, the method including forming a base conductive layer on a base material, the base conductive layer including: a coil wiring portion having one end, other end, and first to third connecting positions, the second connecting position being closer to the other end compared with the first connecting position, the third connecting position being closer to the one end compared with the second connecting position; a power-feed wiring portion that connects the first connecting position with an external power source; and a connection wiring portion that short-circuits the second connecting position and the third connecting position; forming a wiring conductive layer on the base conductive layer by electrolytic plating by feeding power from the external power source; and removing the power-feed wiring portion and the connection wiring portion.

12 Claims, 10 Drawing Sheets

(51) Int. Cl.
*G06K 19/077* (2006.01)
*H01Q 1/38* (2006.01)
*H01Q 1/36* (2006.01)
*H01Q 9/27* (2006.01)
*H05K 3/24* (2006.01)
*H05K 3/18* (2006.01)
*C25D 5/48* (2006.01)
*H01Q 1/48* (2006.01)
*H01Q 7/00* (2006.01)

(52) U.S. Cl.
CPC ............. *H05K 3/188* (2013.01); *H05K 3/241* (2013.01); *H05K 3/242* (2013.01); *H05K 3/246* (2013.01)

(56) References Cited

U.S. PATENT DOCUMENTS

2009/0243781 A1* 10/2009 Nomura .............. H01F 17/0013
336/200
2012/0112869 A1  5/2012 Nishikawa \* cited by examiner

FIG. 10

| Sample | Wiring width [mm] | Connecting position | | Wiring resistance [Ω] | | | Film thickness [µm] | | |
|---|---|---|---|---|---|---|---|---|---|
| | | Power-feed wiring portion [mm] | Connection wiring portion [mm] | Feeding point–Outer peripheral end (R1) | Feeding point–Inner peripheral end (R2) | Resistance ratio R2/R1 | Outer peripheral end (T1) | Inner peripheral end (T2) | Film thickness ratio T2/T1 |
| Example 1 | 0.5 | 140 | 310 | 3.16 | 3.98 | 1.26 | 37.8 | 32.2 | 1.17 |
| Example 2 | 0.5 | 140 | 250 | 3.15 | 2.64 | 0.84 | 33.3 | 37.2 | 0.90 |
| Example 3 | 1 | 140 | 310 | 1.57 | 1.99 | 1.27 | 38 | 33.1 | 1.15 |
| Example 4 | 0.2 | 140 | 310 | 7.84 | 9.97 | 1.27 | 32.5 | 27.6 | 1.18 |
| Example 5 | 0.1 | 140 | 310 | 15.7 | 19.9 | 1.27 | 33.6 | 28.4 | 1.18 |
| Comparative example 1 | 0.5 | 0 | — | 0.01 | 10.1 | 1010 | 47 | 26.3 | 1.79 |
| Comparative example 2 | 0.5 | 140 | — | 3.39 | 7.04 | 2.08 | 31.7 | 22.7 | 1.40 |
| Comparative example 3 | 0.2 | 140 | — | 7.85 | 17.4 | 2.22 | 36.2 | 24.9 | 1.45 |
| Comparative example 4 | 1 | 140 | — | 1.57 | 5.2 | 3.31 | 38.2 | 31 | 1.23 |

METHOD FOR MANUFACTURING PLANAR COIL

BACKGROUND OF THE INVENTION

Field of the Invention

The present invention relates to a method for manufacturing a planar coil, and particularly to a method for manufacturing a planar coil using a wiring component as a precursor of the planar coil by electrolytic plating.
to be used for manufacturing a planar coil.

Description of Related Art

A planar coil represented by an IC tag and an NFC (Near Field radio Communication) antenna is formed by forming a metal layer on a base material, covering a desired region of the metal layer with an etching resist, and removing a region where the resist is not formed by etching. However, according to this method, a clean room is required for forming the etching resist, and a new photomask is required every time a coil shape is changed, thereby increasing an initial cost. To cope with these issues, such a method has been studied that a plating catalyst is printed on a base material in a desired pattern and performing electroless plating to form a metal layer in a desired shape without forming an etching resist (See, for example, Japanese Patent Application Laid-open No. 2010-168413).

Generally, electroless plating has a slow deposition rate and a low productivity. Therefore, electrolytic plating is performed after performing the electroless plating. However, the electrolytic plating has low uniformity of deposition, different from the electroless plating. Therefore, when a planar coil is formed by the electrolytic plating, the following problems occur. That is, when a plating current is supplied from an end of the planar coil, a sufficient plating thickness can be obtained at one end close to a feeding point. However, because the other end of the planar coil is far from the feeding point, the plating thickness becomes insufficient, thereby causing film thickness distribution (film thickness difference) in the planar coil. Particularly, when the planar coil has a spiral pattern, an inner peripheral end becomes an open end surrounded by a spiral pattern loop, and a problem of the film thickness difference between the inner peripheral end and an outer peripheral end becomes noticeable.

If a three-dimensional structure of the spiral pattern is permitted, the inner peripheral end and the outer peripheral end are connected to each other via another wiring layer and the entire pattern is formed into one loop, thereby enabling to solve the problem of the film thickness difference at the both ends easily. However, if the spiral pattern is to be completed in one conductive layer, the above problem still remains.

To suppress a difference in the plating thickness over the entire coil pattern, there has been proposed a method in which electrolytic plating is performed in a state in which each turn of the coil pattern is short-circuited at the time of electrolytic plating by using a negative electrode bar in a plating tank (See Japanese Patent Application Laid-open No. 2009-246363).

However, as described in Japanese Patent Application Laid-Open No. 2009-246363, when an electrode bar for electrolytic plating is used as a short-circuit line, plating growth at a contact position of the electrode bar is partially suppressed, and the entire coil pattern has a non-uniform film thickness distribution. Therefore, another solution has been desired.

SUMMARY

It is therefore an object of the present invention to provide a method for manufacturing a planar coil that does not require a patterning process of a metal layer using an etching resist, and can reduce a film thickness difference even when the planar coil is formed by electrolytic plating.

To solve the above problems, a manufacturing method of a planar coil according to the present invention includes forming a base conductive layer on a base material, the base conductive layer including:

a coil wiring portion having one end, other end, and first to third connecting positions, the second connecting position being closer to the other end compared with the first connecting position, the third connecting position being closer to the one end compared with the second connecting position; a power-feed wiring portion that connects the first connecting position with an external power source; and a connection wiring portion that short-circuits the second connecting position and the third connecting position; forming a wiring conductive layer on the base conductive layer by electrolytic plating by feeding power from the external power source; and removing the power-feed wiring portion and the connection wiring portion.

According to the present invention, because a distance from a feeding point to the other end of the coil wiring portion becomes short temporarily at the time of performing electrolytic plating, the film thickness difference at the both ends of the coil wiring portion after performing the electrolytic plating can be reduced. Further, because the power-feed wiring portion and the connection wiring portion are removed after forming the wiring conductive layer by electrolytic plating, a desired planar coil pattern can be reliably formed.

The manufacturing method of a planar coil according to the present invention further includes forming a base resin layer on the base material before forming the base conductive layer, wherein the forming the base conductive layer is performed by electroless plating to form the base conductive layer on the base resin layer. According to the method, a desired coil pattern can be formed without patterning a metal layer by using an etching resist, and the productivity can be improved by a combination of electroless plating and electrolytic plating.

In the present invention, in the step of removing the power-feed wiring portion and the connection wiring portion, the power-feed wiring portion and the connection wiring portion can be removed physically together with the base material, or the base conductive layer constituting the power-feed wiring portion and the connection wiring portion and the wiring conductive layer can be removed by etching. According to this method, the power-feed wiring portion and the connection wiring portion can be easily removed to complete the planar coil.

In the present invention, the coil wiring portion includes a spiral pattern, and it is preferable that the one end and the other end of the coil wiring portion are respectively an outer peripheral end and an inner peripheral end of the spiral pattern. The inner peripheral end of the spiral pattern is an open end that is surrounded by a spiral loop and is not connected to anywhere. Therefore, an electrical resistance difference between the outer peripheral end and the inner peripheral end is large as it is, and the problem of the film thickness difference is noticeable. However, according to the present invention, by providing the connection wiring portion that short-circuits the inner peripheral end of the coil wiring portion to one point closer to the outer peripheral end side than to the inner peripheral end, the film thickness at the inner peripheral end of the coil wiring portion can be improved, thereby enabling to reduce the film thickness difference at the both ends of the coil wiring portion.

In the present invention, it is preferable that the first connecting position is apart from the outer peripheral end and located on an outermost turn of the spiral pattern. According to this configuration, a distance from a feeding position to the outer peripheral end and a distance from the feeding position to the inner peripheral end can be further reduced, thereby enabling to further reduce the film thickness difference in the conductive layer at the both ends.

In the present invention, it is preferable that the second connecting position is located at the inner peripheral end of the spiral pattern. In this case, it is preferable that the third connecting position is located at a cross point of an innermost turn of the spiral pattern and an extension line extending from the inner peripheral end in a winding direction. With such a configuration, the film thickness difference at the both ends of the spiral pattern can be reduced, and removal of the connection wiring portion can be easily performed. In a case where the number of turns of the spiral pattern is one, the innermost turn is common to the outermost turn.

In the present invention, it is preferable that the base material is a resin film. In this case, it is preferable that the base resin layer is made of resin containing at least one kind of metal selected from Pd, Cu, Ni, Ag, Pt, and Au. Further, it is preferable that the base conductive layer and the wiring conductive layer are made of at least one kind of metal selected from Cu, Ag, and Au, respectively. Accordingly, the conductive pattern can be easily formed on the resin film, and a high-quality planar coil can be manufactured at a low cost.

According to the present invention, it is possible to provide a method for manufacturing a planar coil that does not require a patterning process of a metal layer using an etching resist, and can reduce a film thickness difference even when the planar coil is formed by electrolytic plating.

BRIEF DESCRIPTION OF THE DRAWINGS

The above and other objects, features and advantages of this invention will become more apparent by reference to the following detailed description of the invention taken in conjunction with the accompanying drawings, wherein:

FIG. 1A is a plan view, and FIG. 1B is a sectional view along a line Y-Y in FIG. 1A;

FIG. 3A is a plan view, and FIG. 3B is a sectional view along a line Y-Y in FIG. 3A;

FIG. 4A is a plan view, and FIG. 4B is a sectional view along a line Y-Y in FIG. 4A;

FIG. 5A is a plan view, and FIG. 5B is a sectional view along a line Y-Y in FIG. 5A;

FIG. 10 is a table indicating a result of the evaluation test of the planar coils.

DETAILED DESCRIPTION OF THE EMBODIMENTS

Preferred embodiments of the present invention will now be explained in detail with reference to the drawings.

Figure 1A:
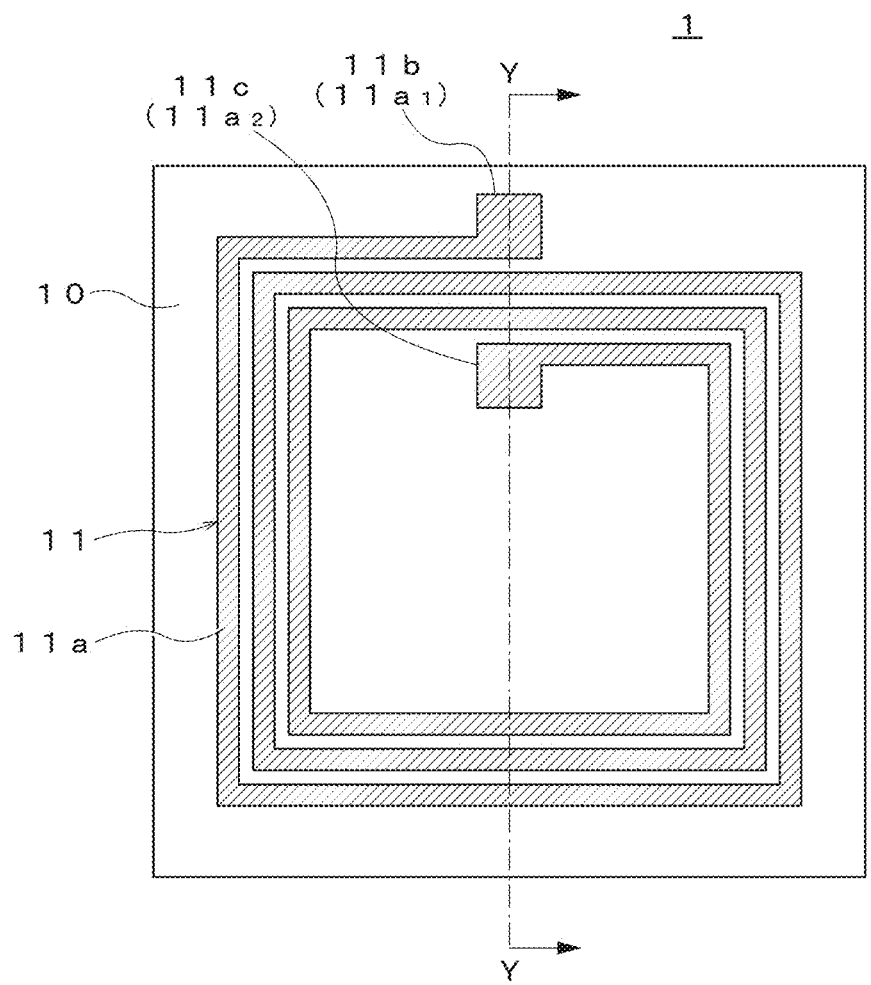
FIGS. 1A and 1B are diagrams showing a configuration of a planar coil according to an embodiment of the present invention, where
Figure 1B:
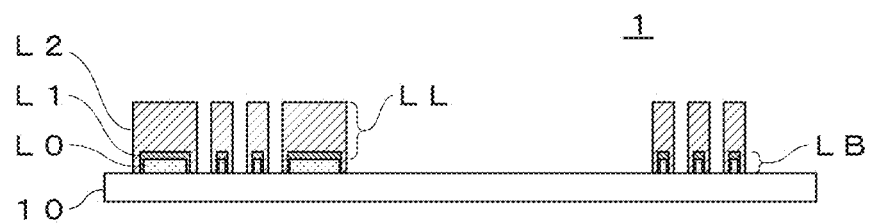

FIGS. 1A and 1B are diagrams showing a configuration of a planar coil according to an embodiment of the present invention. FIG. 1A is a plan view, and FIG. 1B is a sectional view along a line Y-Y in FIG. 1A.

As shown in FIGS. 1A and 1B, a planar coil 1 includes a base material 10, and a spiral planar coil pattern 11 formed on one of principal surfaces of the base material 10. The base material 10 is preferably made of, for example, a resin film (a flexible substrate) such as a PET film or a polyimide film. When the resin film is used, an extremely thin planar coil 1 that is easily handled can be manufactured at a low cost. However, the base material 10 can be a rigid substrate such as a glass epoxy substrate. Further, the base material 10 can have a single layer structure or a multi-layer structure.

The planar coil pattern 11 includes a spiral coil wiring portion 11a, and pads 11b and 11c provided respectively at an outer peripheral end $11a_1$ (one end) and an inner peripheral end $11a_2$ (the other end) of the coil wiring portion 11a. The coil wiring portion 11a according to the present embodiment has a rectangular spiral pattern. However, the coil wiring portion 11a can have a circular spiral pattern, or an elliptical or oval spiral pattern. It is preferable that the number of turns of the coil wiring portion 11a is at least one turn, and is particularly preferable that the number of turns is 2 to 10 turns. It is because, if the number of turns is less than one, the problem to be solved by the present invention hardly occurs, and if the number of turns is too large, such an effect of the present invention that a resistance difference at both ends of the coil wiring portion 11a is reduced cannot be obtained.

The width of the coil wiring portion 11a is preferably from 0.05 millimeter to 1 millimeter, and particularly preferably from 0.1 millimeter to 0.5 millimeter. It is because it is difficult to form an extremely fine planar coil pattern 11 having a wiring width of less than 0.05 millimeter by electrolytic plating. Further, it is because a problem of a film thickness difference at a coil end portion due to a resistance difference between the both ends, that is, between the outer peripheral end $11a_1$ and the inner peripheral end $11a_2$ hardly occurs in a coil wiring portion 11a having a wiring width exceeding 1 millimeter.

A cross-section structure of the planar coil pattern 11 includes a base resin layer L0, a base conductive layer L1 formed on the base resin layer L0 by electroless plating, and a wiring conductive layer L2 formed on the base conductive layer L1 by electrolytic plating. The base resin layer L0 and the base conductive layer L1 constitute a base layer LB having a multi-layer structure with respect to the wiring conductive layer L2. Further, the base conductive layer L1 and the wiring conductive layer L2 constitute a conductive layer LL as a conductive pattern constituting the planar coil pattern 11.

The base resin layer L0 is preferably made of resin (conductive polymer) including at least one kind of metal selected from Pd, Cu, Ni, Ag, Pt, and Au. The conductive layer LL can be formed on the base material 10 by providing the base resin layer L0.

The base conductive layer L1 is preferably made of at least one kind of metal selected from Cu, Ag, and Au. The wiring conductive layer L2 can be formed on the base material 10 by electrolytic plating by providing the base conductive layer L1. The thickness of the base conductive layer L1 is preferably from 0.05 micrometer to 2 micrometers.

The wiring conductive layer L2 may be a thicker layer than the base conductive layer L1, and is preferably made of at least one kind of metal selected from Cu, Ag, and Au. The conductive layer LL having a sufficient thickness can be formed on the base material 10 by providing the wiring conductive layer L2.

The thickness of the conductive layer LL is not particularly limited. However, the thickness of the conductive layer LL is preferably 50 micrometers or less, and is particularly preferably 38 micrometers or less. It is because a processing time by electrolytic plating increases as the thickness of the conductive layer LL constituting the planar coil pattern 11 increases, and the productivity decreases. Meanwhile, the thickness of the conductive layer LL is preferably 1 micrometer or more. It is because if the thickness of the conductive layer LL is too thin, a sufficient productivity can be obtained only by electroless plating having good uniformity of deposition and there is less significance in forming the conductive layer LL by electrolytic plating.

Figure 2:
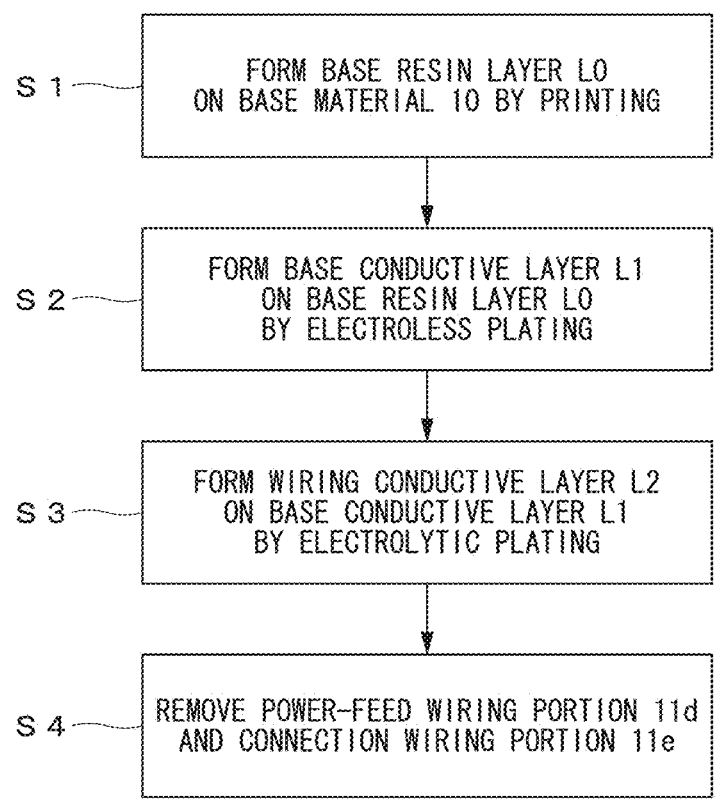
FIG. 2 is a flowchart explaining a manufacturing method of the planar coil.
Figure 3A:
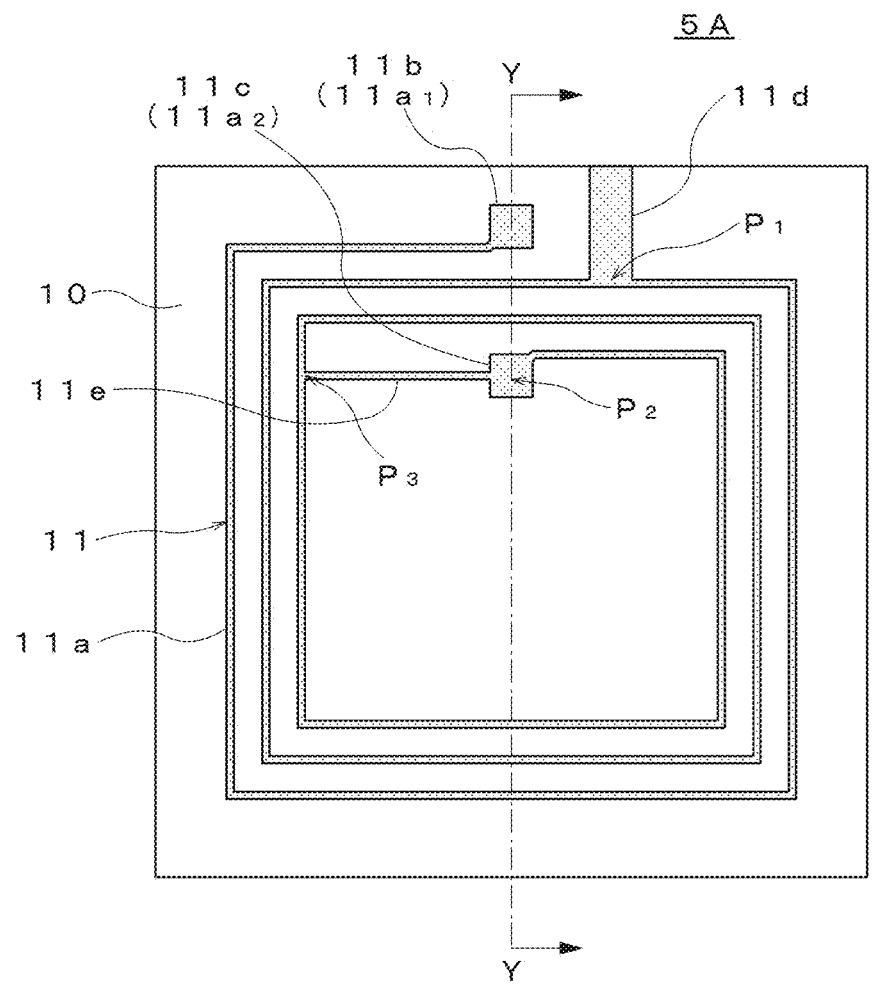
FIGS. 3A and 3B are explanatory diagrams for explaining one of manufacturing processes of the planar coil (printing process), where
Figure 3B:
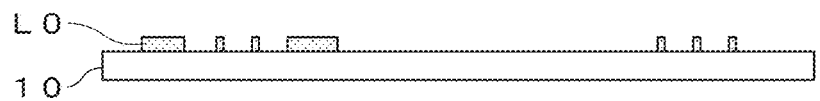
Figure 4A:
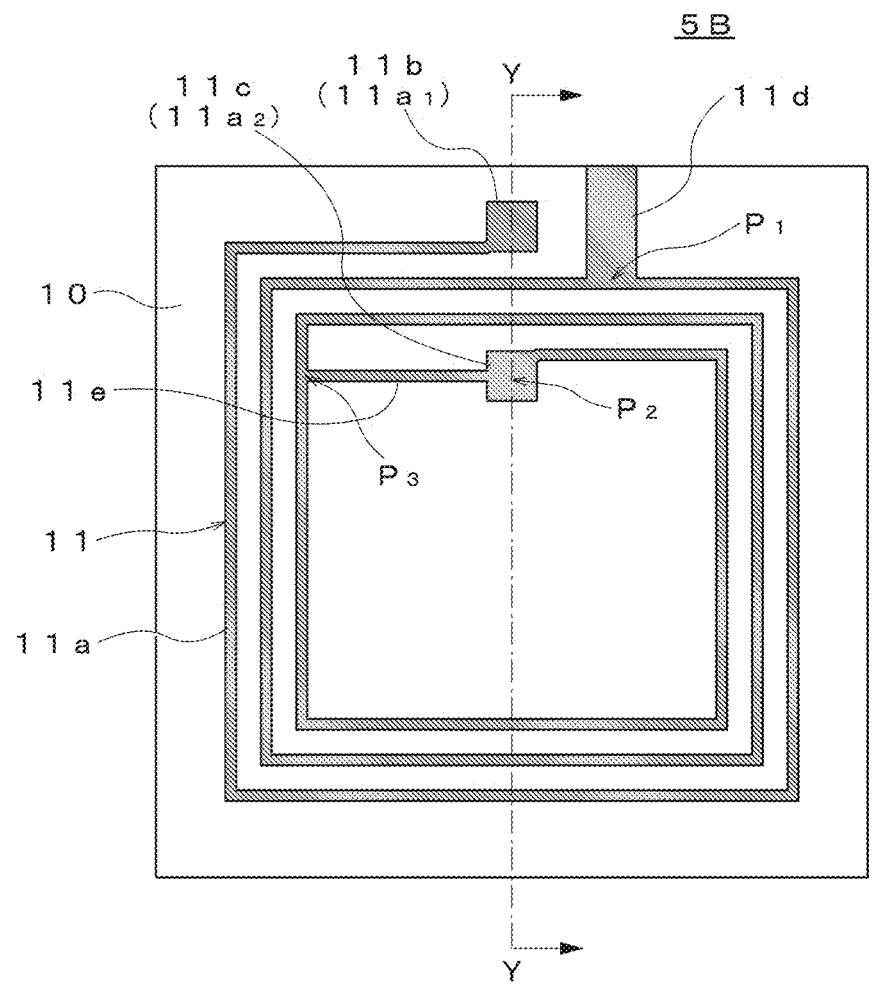
FIGS. 4A and 4B are explanatory diagrams for explaining one of manufacturing processes of the planar coil (electroless plating process), where
Figure 4B:
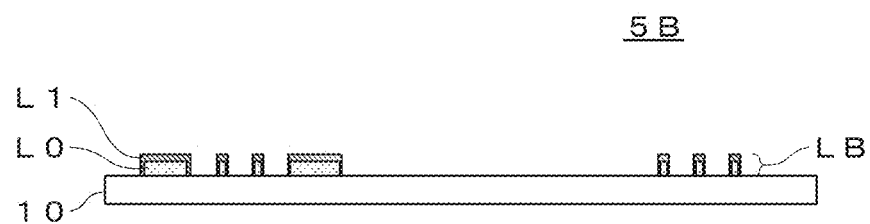
Figure 5A:
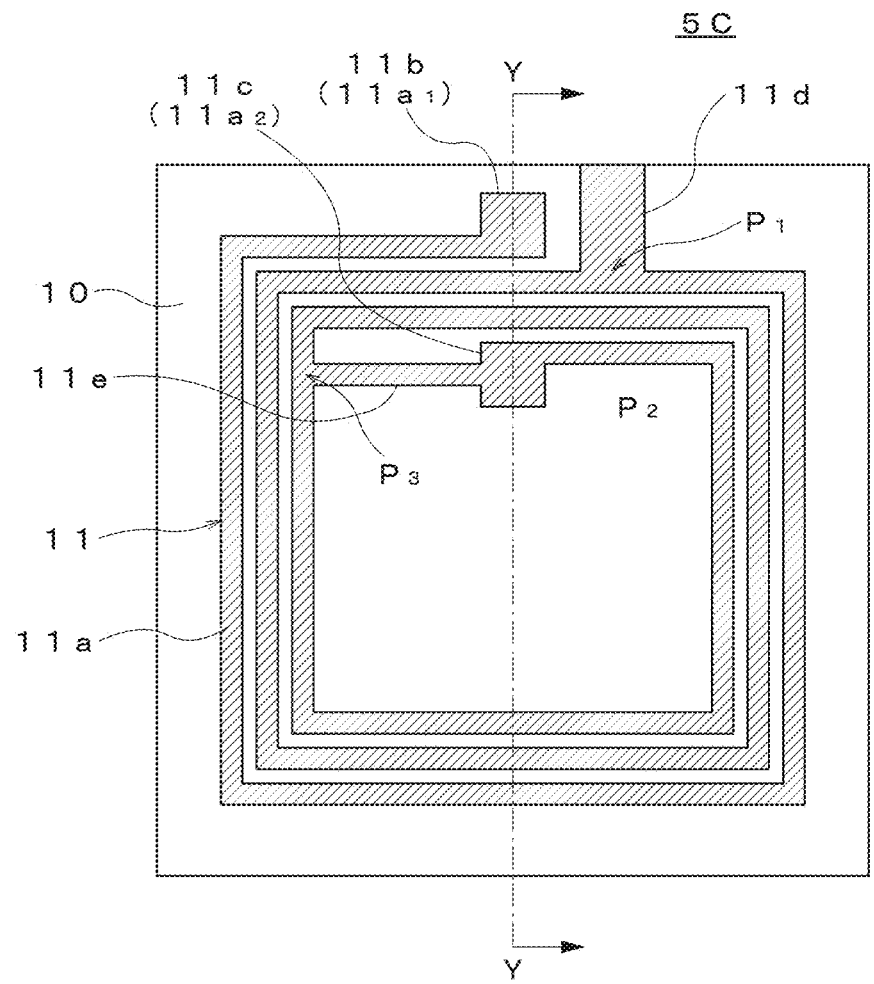
FIGS. 5A and 5B are explanatory diagrams for explaining one of manufacturing processes of the planar coil (electrolytic plating process), where
Figure 5B:
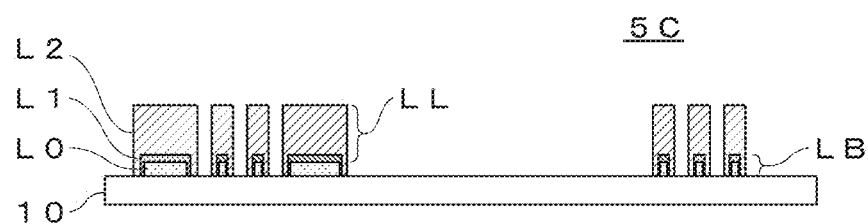

FIG. 2 is a flowchart explaining a manufacturing method of the planar coil. FIGS. 3A, 3B, 4A, 4B, 5A, and 5B are explanatory diagrams of manufacturing processes of the planar coil. FIGS. 3A, 4A, and 5A are plan views, and FIGS. 3B, 4B, and 5B are sectional views along a line Y-Y in FIGS. 3A, 4A, and 5A, respectively.

As shown in FIG. 2 and FIGS. 3A and 3B, in manufacturing of the planar coil 1, the base resin layer L0 is first formed on the base material 10 (FIG. 2: Step S1). The base resin layer L0 functions as a catalyst that promotes formation of the base conductive layer L1 by electroless plating. The base resin layer L0 is preferably formed by printing, and can be formed, for example, by screen printing or an inkjet method. In this way, the base material 10 formed with the base resin layer L0 constitutes a wiring component 5A as a first intermediary body with respect to the planar coil 1. According to the manufacturing method of the planar coil 1 according to the present embodiment, the wiring component 5A for manufacturing a planar coil can be prepared beforehand to start manufacturing of the planar coil 1.

As shown in FIG. 3A, a planar shape of the base resin layer L0 includes the spiral coil wiring portion 11a that constitutes the planar coil pattern 11, the pads 11b and 11c respectively provided at the both ends of the coil wiring portion 11a, a power-feed wiring portion 11d connected to a point in the middle (the first connecting position) of the coil wiring portion 11a, and a connection wiring portion 11e that short-circuits the inner peripheral end $11a_2$ (the second connecting position) of the coil wiring portion 11a and a connecting position (the third connecting position) closer to the outer peripheral end $11a_1$ side than to the inner peripheral end $11a_2$.

The power-feed wiring portion 11d has a wiring pattern connected on the side of the outer peripheral end $11a_1$ of the coil wiring portion 11a, and is provided to feed power from the external power source to the coil wiring portion 11a at the time of performing electrolytic plating. A connecting position (the first connecting position) $P_1$ of the power-feed wiring portion 11d is preferably connected to the middle of the outermost turn of the coil wiring portion 11a, and particularly preferably connected to the side of the inner peripheral end $11a_2$ of the outermost turn as close as possible. Accordingly, a difference between a wiring length from a connecting point (a feeding point) with the power-feed wiring portion 11d of the coil wiring portion 11a to the inner peripheral end $11a_2$ and a wiring length from the feeding point to the outer peripheral end $11a_1$ is reduced to reduce a resistance difference at the both ends. Therefore, the coil wiring portion 11a having a small film thickness difference between the both ends can be obtained. However, if the connecting position $P_1$ of the power-feed wiring portion 11d approaches too close to the side of the inner peripheral end $11a_2$, a distance between the power-feed wiring portion 11d and the outer peripheral end $11a_1$ of the coil wiring portion 11a becomes too close to each other, and formation of the power-feed wiring portion 11d and removal of the power-feed wiring portion 11d described later become difficult. Accordingly, an appropriate gap is required between the connecting position $P_1$ and the inner peripheral end $11a_2$.

To reduce the influence of wiring resistance of the power-feed wiring portion 11d, the width thereof is preferably equal to or larger than the width of the coil wiring portion 11a, and particularly preferably larger than the width of the coil wiring portion 11a. The number of the power-feed wiring portion 11d is not particularly limited, and the arbitrary number of power-feed wiring portions 11d can be connected. However, the power-feed wiring portion 11d needs to be removed eventually to obtain the planar coil 1, and it is not desired to increase the number of the power-feed wiring portions 11d excessively, because it leads to an increase of the manufacturing cost.

The connection wiring portion 11e has a wiring pattern that short-circuits the inner peripheral end $11a_2$ (the second connecting position $P_2$) of the coil wiring portion 11a and an arbitrary position (the third connecting position $P_3$) closer to the outer peripheral end $11a_1$ side than to the inner peripheral end $11a_2$, and is provided to reduce a distance (a wiring length) from the feeing point to the inner peripheral end $11a_2$ as much as possible. In the present embodiment, the connection wiring portion 11e passes through the inner peripheral end $11a_2$ and is connected to a position extending straight in the winding direction from the outer peripheral end $11a_1$ toward the inner peripheral end $11a_2$ and crossing the innermost turn. In this way, the wiring length from the feeding point of the coil wiring portion 11a to the inner peripheral end $11a_2$ is reduced as much as possible by providing the connection wiring portion 11e, thereby enabling to resolve the problem of insufficient film thickness of the conductive layer LL at the inner peripheral end $11a_2$ due to the electrical resistance.

Next, as shown in FIGS. 4A and 4B, the base conductive layer L1 is formed on the base resin layer L0 by electroless plating (FIG. 2: Step S2). A specific method of the electroless plating is not particularly limited, and the electroless plating can be performed by various methods. The thickness of the base conductive layer L1 is preferably from 0.01 micrometer to 1 micrometer, and particularly preferably from 0.05 micrometer to 0.5 micrometer. The base conductive layer L1 is preferably made of at least one kind of metal selected from Cu, Ag, and Au. In this way, the base material 10 having the base resin layer L0 and the base conductive layer L1 formed thereon sequentially constitutes a wiring component 5B as a second intermediary body with respect to the planar coil 1. In the manufacturing method of the planar coil 1 according to the present embodiment, the wiring component 5B for manufacturing a planar coil can be prepared beforehand to start manufacturing of the planar coil 1.

As shown in FIG. 4B, the base conductive layer L1 is formed not only on an upper surface of the base resin layer L0. That is, in practice, the base conductive layer L1 is thinly formed not only on the upper surface of the base resin layer L0 but also on the side surfaces thereof. That is, the entire exposed surface of the base resin layer L0 is covered with the base conductive layer L1 by electroless plating.

Figure 6:
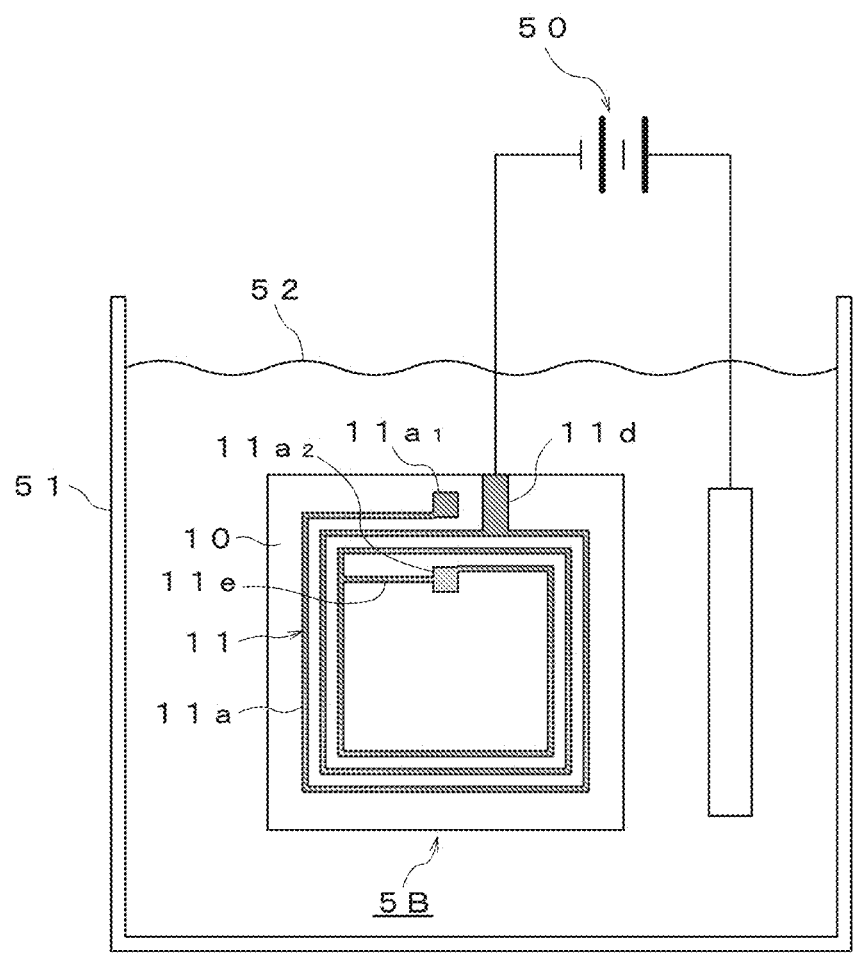
FIG. 6 is a schematic diagram for explaining an electrolytic plating process.

As shown in FIGS. 5A and 5B, an electrolytic plating process with respect to the wiring component 5B is performed to form the wiring conductive layer L2 on the base conductive layer L1 (FIG. 2: Step S3). As shown in FIG. 6, in the electrolytic plating process, the wiring component 5B is immersed in a plating solution 52 in a plating tank 51, in a state with an external power source 50 being connected to the power-feed wiring portion 11d, and a voltage is applied to the coil wiring portion 11a via the power-feed wiring portion 11d. A specific method of the electrolytic plating is not particularly limited, and the electrolytic plating can be performed by various methods. In this way, the base material 10 having the base resin layer L0, the base conductive layer L1, and the wiring conductive layer L2 formed thereon sequentially constitutes a wiring component 5C as a third intermediary body with respect to the planar coil 1.

As shown in FIG. 5B, the wiring conductive layer L2 is formed not only on the upper surface of the base conductive layer L1. That is, in practice, the wiring conductive layer L2 is thinly formed not only on the upper surface of the base conductive layer L1 but also on the side surfaces thereof. That is, the entire exposed surface of the base conductive layer L1 is covered with the wiring conductive layer L2 by the electrolytic plating.

In a conventional method in which the connection wiring portion 11e is not provided, there is a problem that the resistance difference between the both ends of the coil wiring portion 11a is large in electrolytic plating for forming the wiring conductive layer L2, and the film thickness difference between the both ends of the coil wiring portion 11a becomes large. However, in the present embodiment, because the resistance difference between the both ends of the coil wiring portion 11a can be reduced by providing the connection wiring portion 11e and the power-feed wiring portion 11d, the film thickness difference between the outer peripheral end 11a₁ and the inner peripheral end 11a₂ can be reduced.

Figure 7:
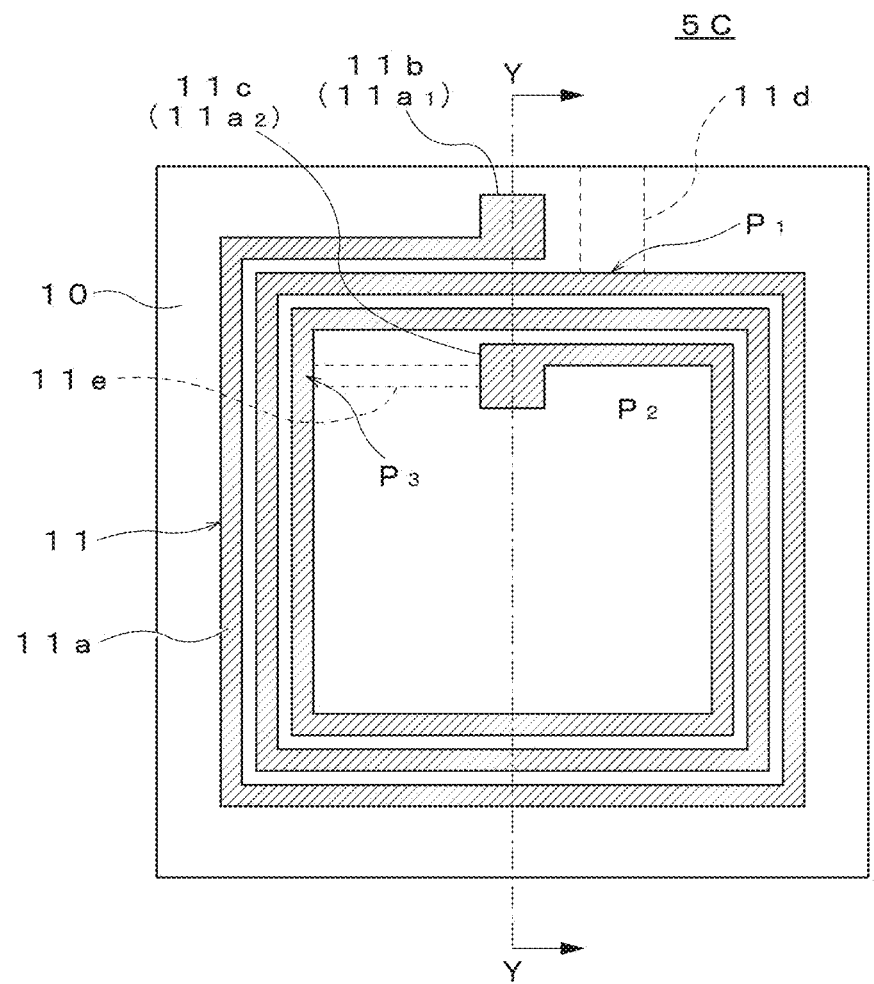
FIG. 7 is a plan view for explaining one of manufacturing processes of the planar coil (removing process)

Lastly, as shown in FIG. 7, the power-feed wiring portion 11d and the connection wiring portion 11e in the wiring component 5C are removed (FIG. 2: Step S4). A removal method is not particularly limited, and physical means such as punching or cutting, or chemical means such as etching can be used. If the base material 10 is a resin film, it is easy to remove the power-feed wiring portion 11d and the connection wiring portion 11e physically together with the base material 10 by punching or cutting. In a case where the power-feed wiring portion 11d and the connection wiring portion 11e are removed without removing the base material 10, the conductive layer LL (the base conductive layer L1 and the wiring conductive layer L2) constituting the power-feed wiring portion 11d and the connection wiring portion 11e can be removed by using etching. At this time, the base resin layer L0 can be left on the base material 10, or can be removed by using a solvent or the like. Accordingly, the planar coil 1 shown in FIG. 1 is complete.

FIGS. 8A to 8F are plan views showing modifications of the planar coil pattern 11.

Figure 8A:
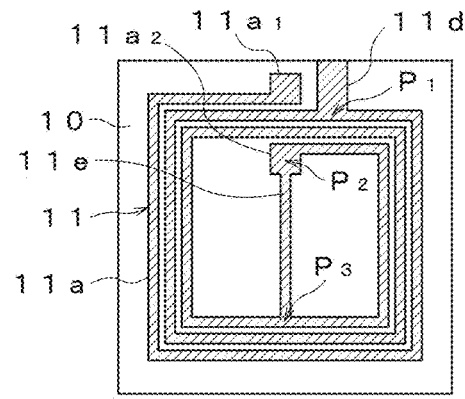
FIGS. 8A to 8F are plan views showing modifications of the planar coil pattern.

In the planar coil pattern 11 shown in FIG. 8A, the connecting position (the second connecting position) P₂ at one end of the connection wiring portion 11e is set to the inner peripheral end 11a₂ of the coil wiring portion 11a, and the connecting position (the third connecting position) P₃ at the other end of the connection wiring portion 11e passes through the center of a loop from the inner peripheral end 11a₂ of the coil wiring portion 11a and is set to a point in the middle of the innermost turn of the coil wiring portion 11a on the opposite side of the inner peripheral end 11a₂. That is, the connection wiring portion 11e advances in a direction orthogonal to the winding direction that passes through the inner peripheral end 11a₂ and is connected to a position crossing the innermost turn.

Figure 8B:
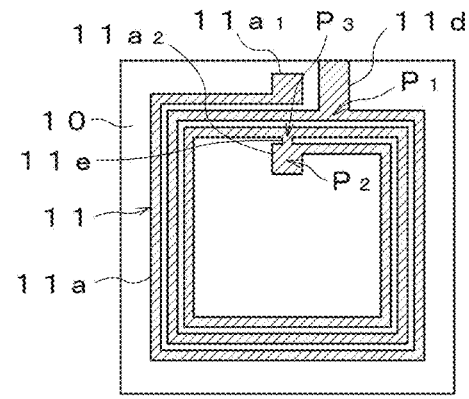

In the planar coil pattern 11 shown in FIG. 8B, the connecting position (the second connecting position) P₂ at one end of the connection wiring portion 11e is set to the inner peripheral end 11a₂ of the coil wiring portion 11a, and the connecting position (the third connecting position) P₃ at the other end of the connection wiring portion 11e extends from the inner peripheral end 11a₂ of the coil wiring portion 11a outside the loop and is set at a start position of the innermost turn of the coil wiring portion 11a. That is, the connection wiring portion 11e is provided to short-circuit between adjacent turns of the spiral turn. Accordingly, the inner peripheral end 11a₂ of the coil wiring portion 11a can be short-circuited to a position closer to the feeding point than that in the case shown in FIG. 8A, and the film thickness difference at the both ends can be further reduced. However, removal of the connection wiring portion 11e becomes more difficult than the case shown in FIG. 8A.

Figure 8C:
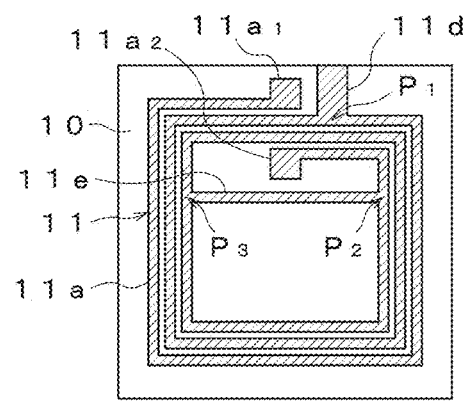

In the planar coil pattern 11 shown in FIG. 8C, the connecting position (the second connecting position) P₂ at one end of the connection wiring portion 11e is set at a position closer to the outer peripheral end 11a₁ side than to the inner peripheral end 11a₂ of the coil wiring portion 11a, and the connecting position (the third connecting position) P₃ at the other end of the connection wiring portion 11e extends in parallel with the winding direction passing through the inner peripheral end 11a₂ of the coil wiring portion 11a and is set to a point in the middle of the innermost turn. In this way, the one end and the other end of the connection wiring portion 11e can be set at an arbitrary position on the innermost turn of the coil wiring portion 11a.

Figure 8D:
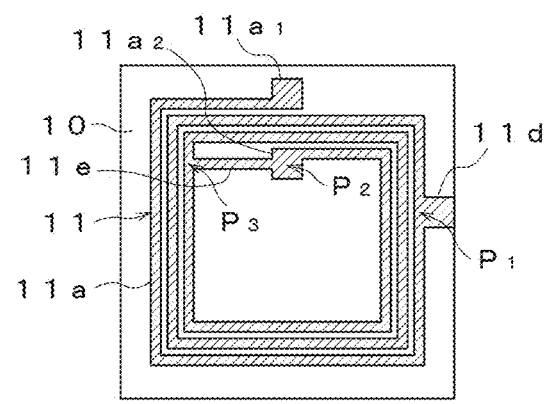
Figure 8E:
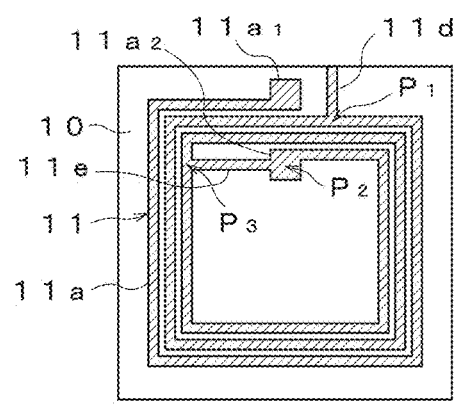
Figure 8F:
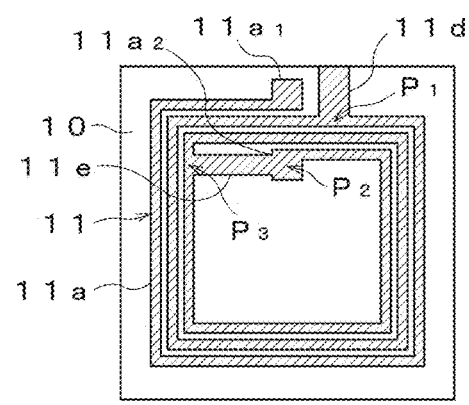

In the planar coil pattern 11 shown in FIG. 8D, the connecting position (the first connecting position) P₁ of the power-feed wiring portion 11d is set further on the side of the outer peripheral end 11a₁ of the coil wiring portion 11a as compared to the case shown in FIG. 3. In the planar coil pattern 11 shown in FIG. 8E, the wiring width of the power-feed wiring portion 11d is narrower than that in the case shown in FIG. 3, and the power-feed wiring portion 11d is formed by wiring having the same width as the coil wiring portion 11a. In the planar coil pattern 11 shown in FIG. 8F, the wiring width of the connection wiring portion 11e is wider than that in the case shown in FIG. 3, and the connection wiring portion 11e is formed by wider than the coil wiring portion 11a. In this way, various pattern layouts and wiring widths can be adopted for the power-feed wiring portion 11d and the connection wiring portion 11e.

As described above, the wiring component 5B according to the present embodiment includes the base material 10 and the planar coil pattern 11 formed on the base material 10. The planar coil pattern 11 includes the coil wiring portion 11a, the power-feed wiring portion 11d that connects the first connecting position of the coil wiring portion 11a and the external power source, and the connection wiring portion 11e that short-circuits the second position of the coil wiring portion, being closer to the other end side than to the first connecting position, and the third connecting position of the coil wiring portion, being closer to the one end side than to the second connecting position. The cross-section structure of the planar coil pattern 11 has the base resin layer L0 formed on the base material 10, and the conductive layer (the base conductive layer L1) formed on the base resin layer L0. Because the connection wiring portion 11e reduces the resistance difference between the both ends of the coil wiring portion 11a, the film thickness difference between the both ends of the planar coil pattern 11 can be reduced at the time of performing electrolytic plating, and the quality of the planar coil 1 can be improved. Because the cross-section structure of the planar coil pattern 11 has the base resin layer L0 formed on the base material 10, and the base conductive layer L1 formed on the base resin layer L0, the wiring conductive layer L2 can be formed by electrolytic plating, and the planar coil pattern 11 can be easily formed without using an etching resist.

In the wiring component 5B according to the present embodiment, because the power-feed wiring portion 11d is connected to a position closer to the inner peripheral end $11a_2$ side than the outer peripheral end $11a_1$ of the coil wiring portion 11a, the power-feed wiring portion 11d can further reduce the resistance difference at the both ends of the coil wiring portion 11a at the time of performing electrolytic plating. Accordingly, the film thickness difference at the both ends of the planar coil can be reduced, and the quality of the planar coil can be improved.

In the manufacturing method of the planar coil according to the present embodiment, because the power-feed wiring portion 11d and the connection wiring portion 11e are removed after the power-feed wiring portion 11d and the connection wiring portion 11e are formed together with the coil wiring portion 11a by electrolytic plating, the film thickness difference at the both ends of the planar coil pattern can be reduced, and electrical characteristics of the planar coil can be improved.

A preferred embodiment of the present invention has been descried above. However, the present invention is not limited to the above embodiment, but various modifications can be made within the spirit of the present invention, and it is needless to say that such modifications are also included in the scope of the present invention.

For example, in the present embodiment, a case in which after the base resin layer L0 containing a catalyst for electroless plating is formed by printing, the base conductive layer L1 is formed by electroless plating, and the wiring conductive layer L2 is formed by electrolytic plating has been exemplified. However, the present invention is not limited to such a manufacturing method, and can be applied to the conventional method in which, for example, after a desired coil pattern is formed by etching of a metal layer by using an etching resist, electrolytic plating is performed with respect to the metal layer.

Examples

Figure 9A:
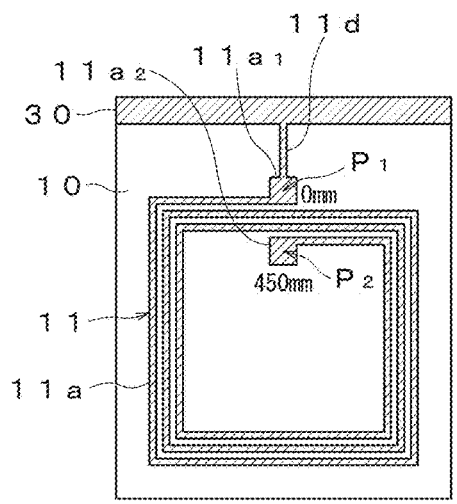
FIGS. 9A to 9C are plan views showing a configuration of wiring patterns of wiring components used in an evaluation test of planar coils.
Figure 9B:
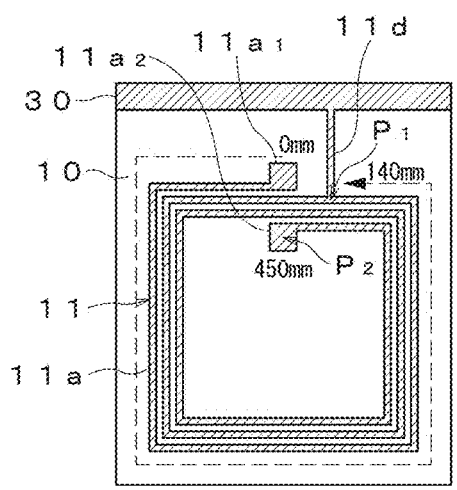
Figure 9C:
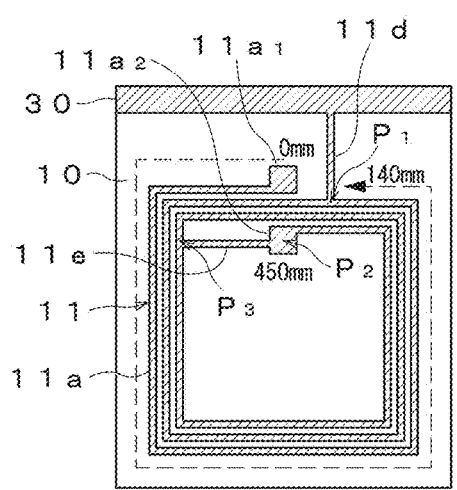

An evaluation test was performed for wiring resistance and film thickness distribution of the planar coils 1 respectively prepared by using the wiring components 5A according to comparative examples 1 to 4 and examples 1 to 5 having wiring patterns shown in FIGS. 9A to 9C.

As shown in FIG. 9A, the wiring component 5A in comparative example 1 includes the spiral coil wiring portion 11a and the power-feed wiring portion 11d connected to the outer peripheral end $11a_1$ of the coil wiring portion 11a (that is, a position at 0 millimeter from the outer peripheral end $11a_1$). However, the connection wiring portion 11e is not provided. The power-feed wiring portion 11d is connected to an external power source via a main wiring 30 formed on the base material 10. The base resin layer L0 constituting these wiring patterns was formed by screen printing resin containing Pd as a catalyst onto a PET film. It was set such that the shape of the coil wiring portion 11a was common to all the wiring components 5A, the number of turns of the coil wiring portion 11a was three, the entire length of the wiring from the outer peripheral end $11a_1$ to the inner peripheral end $11a_2$ was 450 millimeters, and the wiring width was 0.5 millimeter. Further, the maximum loop size (vertical width Wy×lateral width Wx) was set to 50 millimeters×50 millimeters.

As shown in FIG. 9B, the wiring component 5A in comparative examples 2 to 4 includes the spiral coil wiring portion 11a and the power-feed wiring portion 11d connected not to the outer peripheral end $11a_1$ of the coil wiring portion 11a but to the vicinity of a termination position of the outermost turn (the position $P_1$ at 140 millimeters from the outer peripheral end $11a_1$). However, the connection wiring portion 11e is not provided. The wiring width in the comparative example 2 was set to 0.5 millimeter; however, the wiring width in the comparative example 3 was set to 0.2 millimeter, and the wiring width in the comparative example 4 was set to 1 millimeter. Other configurations were set to be the same as those shown in FIG. 9A.

As shown in FIG. 9C, the wiring component 5A according to examples 1 to 5 includes the spiral coil wiring portion 11a, the power-feed wiring portion 11d connected to the vicinity of a termination position of the outermost turn of the coil wiring portion 11a (the position $P_1$ at 140 millimeters from the outer peripheral end $11a_1$), and the connection wiring portion 11e that short-circuits the inner peripheral end $11a_2$ of the coil wiring portion 11a and a position closer to the outer peripheral end $11a_1$ side than to the inner peripheral end $11a_2$. The connecting position $P_2$ at one end of the connection wiring portion 11e was set to the inner peripheral end $11a_2$ in the respective examples 1 to 5. The connecting position $P_3$ at the other end of the connection wiring portion 11e was set to a position at 310 millimeters from the outer peripheral end $11a_1$ in the examples 1, 3, 4, and 5, and to a position at 250 millimeters from the outer peripheral end $11a_1$ in the example 2. The wiring width was set to 0.5 millimeter in the examples 1 and 2, 1 millimeter in the example 3, 0.2 millimeter in the example 4, and 0.1 millimeter in the example 5. Other configurations were set to be the same as those shown in FIG. 9A.

Electroless copper plating was performed to the wiring components 5A in the comparative examples 1 to 4 and the examples 1 to 5, and the base conductive layer L1 consisting of a Cu film having a thickness of about 1.5 micrometers was formed on the base resin layer L0 to obtain the wiring component 5B as a precursor of the planar coil 1. A fluorescent X-ray film thickness meter (FT 9300 manufactured by Hitachi High-Tech Science Corporation) was used to measure the film thickness of the base conductive layer L1. Thereafter, wiring resistance R1 from the feeding point to the outer peripheral end $11a_1$ and wiring resistance R2 from the feeding point to the inner peripheral end $11a_2$ of the planar coil 1 in the comparative examples 1 to 4 and the examples 1 to 5 were respectively measured by a four-terminal method to obtain a resistance ratio R2/R1.

Next, electrolytic plating was performed at a current density of 4 A/dm² for 30 minutes, to form the wiring conductive layer L2 consisting of a Cu film on the base conductive layer L1, thereby obtaining the wiring component 5C as a precursor of the planar coil 1. Further, the power-feed wiring portion 11d and the connection wiring portion 11e were removed by punching to complete the planar coils 1 according to the comparative examples 1 to 4 and the examples 1 to 5. Thereafter, the film thickness of the conductive layers LL at the inner peripheral ends $11a_2$ and the outer peripheral ends $11a_1$ of the planar coils 1 was measured, to obtain a film thickness ratio T2/T1. For measuring the film thickness, an electrical resistance thickness meter (RMP30-S manufactured by Fischer Instruments K.K.) was used. Further, observational evaluation of the film thickness was performed by using an SEM (SS-550 manufactured by Shimazu Corporation) by exposing the cross-sectional surface of the conductive layer LL. The result thereof is shown in a table in FIG. 10.

As can be understood from FIG. 10, in the planar coil 1 in the comparative example 1, because the power-feed wiring portion 11d was directly connected to the outer peripheral end $11a_1$, the wiring resistance R1 from the feeding point to the outer peripheral end $11a_1$ was approximately zero. However, the wiring resistance R2 from the feeding point to the inner peripheral end $11a_2$ was as large as 10.1Ω, and hence the ratio R2/R1 between the wiring resistance R1 on the side of the outer peripheral end $11a_1$ and the wiring resistance R2 on the side of the inner peripheral end $11a_2$ became extremely large as 1010. Further, while the film thickness T1 at the outer peripheral end $11a_1$ of the coil wiring portion 11a was extremely thick as 47 micrometers, the film thickness T2 at the inner peripheral end $11a_2$ was extremely thin as 26.3 micrometers. Therefore, the film thickness ratio T2/T1 at the both ends of the coil wiring portion 11a became as large as 1.79.

In the planar coil 1 in the comparative example 2, by providing the power-feed wiring portion 11d not at the outer peripheral end $11a_1$ but in the middle of the coil wiring portion 11a, the ratio R2/R1 between the wiring resistance R1 on the side of the outer peripheral end $11a_1$ and the wiring resistance R2 on the side of the inner peripheral end $11a_2$ was decreased to 2.08, and the film thickness ratio T2/T1 at the both ends of the coil wiring portion 11a became as small as 1.40.

In the planar coil 1 in the comparative example 3, because the wiring width became narrower than that of the comparative example 2, the wiring resistances R1 and R2 respectively increased to R1=7.85 and R2=17.4, and the resistance ratio R2/R1 became 2.22. Further, the film thickness ratio T2/T1 at the both ends became 1.45, which was slightly higher than that of the comparative example 2. In the planar coil 1 in the comparative example 4, because the wiring width became wider than that of the comparative example 2, the wiring resistances R1 and R2 respectively decreased to R1=1.57 and R2=5.2, the resistance ratio R2/R1 became 3.31. Further, the film thickness ratio T2/T1 at the both ends became 1.23, which was slightly lower than that of the comparative example 2.

In the planar coil 1 in the example 1, by providing the connection wiring portion 11e, the wiring resistance R2 from the feeding point to the inner peripheral end $11a_2$ decreased to 3.98Ω, and the resistance ratio R2/R1 became 1.26. Further, the film thickness T1 at the outer peripheral end $11a_1$ of the coil wiring portion 11a became 37.8 micrometers, and the film thickness T2 at the inner peripheral end $11a_2$ thereof became 32.2 micrometers. Therefore, the film thickness ratio T2/T1 at the both ends became 1.17, which was lower than those of the comparative examples 1 to 4. If the film thickness ratio T2/T1 is within a range from 0.8 to 1.2, it can be said that the film thickness ratio is good.

In the planar coil 1 in the example 2, because the connecting position at the other end of the connection wiring portion 11e was changed from 310 millimeters in the example 1 to the position at 250 millimeters, the wiring resistance R2 on the side of the inner peripheral end $11a_2$ further decreased, thereby further decreasing the resistance ratio R2/R1 to 0.84. Further, the film thickness ratio T2/T1 at the both ends became 0.90, which was lower than that of the example 1.

In the planar coil 1 in the example 3, because the wiring width was changed from 0.5 millimeter in the example to 1 millimeter, the wiring resistances R1 and R2 respectively decreased to R1=1.57Ω and R2=1.99Ω, and the resistance ratio R2/R1 became 1.27. Further, the film thickness ratio T2/T1 at the both ends became 1.15, which was a good film thickness ratio as in the example 1.

In the planar coil 1 in the example 4, because the wiring width was changed from 0.5 millimeter in the example to 0.2 millimeter, the wiring resistances R1 and R2 respectively increased to R1=7.84Ω and R2=9.97Ω. However, the resistance ratio R2/R1 became 1.27. Further, the film thickness ratio T2/T1 at the both ends became 1.18, which was a good film thickness ratio as in the example 1.

In the planar coil 1 in the example 5, because the wiring width was further decreased to 0.1 millimeter, the wiring resistances R1 and R2 respectively increased to R1=15.7Ω and R2=19.9Ω. However, the resistance ratio R2/R1 became 1.27. Further, the film thickness ratio T2/T1 at the both ends became 1.18, which was a good film thickness ratio as in the example 1.

What is claimed is:

1. A method for manufacturing a planar coil, the method comprising:
    forming a base conductive layer on a base material, the base conductive layer including:
        a coil wiring portion formed together with a power-feed wiring portion and a connection wiring portion, the coil wiring portion including a spiral pattern having one end that is an outer peripheral end of the spiral pattern and an other end that is an inner peripheral end of the spiral pattern and first to third connecting positions, the second connecting position being closer to the other end than the first connecting position, the third connecting position being closer to the one end than the second connecting position, the power-feed wiring portion being configured to connect the first connecting position with an external power source, and the connection wiring portion being configured to short circuit the second connecting position and the third connecting position;
    forming a wiring conductive layer on the base conductive layer by electrolytic plating by feeding power from the external power source; and
    removing the power-feed wiring portion and the connection wiring portion, wherein
    the first connecting position is disposed apart from the outer peripheral end and located on an outermost turn of the spiral pattern, the second and third connecting positions are located on an innermost turn of the spiral pattern, an inner peripheral distance along the spiral pattern from the first connecting position to the inner peripheral end is smaller than an outer peripheral distance along the spiral pattern from the first connecting position to the outer peripheral end, and no other power-feed wiring portion is connected within a range from the first connecting position to the outer peripheral end.

2. The method for manufacturing the planar coil as claimed in claim 1, further comprising:

forming a base resin layer on the base material before forming the base conductive layer, wherein forming the base conductive layer is performed by electroless plating to form the base conductive layer on the base resin layer.

3. The method for manufacturing the planar coil as claimed in claim 2, wherein the base resin layer includes at least one of metal selected from Pd, Cu, Ni, Ag, Pt, and Au.

4. The method for manufacturing the planar coil as claimed in claim 1, wherein removing is performed by physically removing a part of the base material together with the power-feed wiring portion and the connection wiring portion.

5. The method for manufacturing the planar coil as claimed in claim 1, wherein removing is performed by etching the base conductive layer and the wiring conductive layer constituting the power-feed wiring portion and the connection wiring portion.

6. The method for manufacturing the planar coil as claimed in claim 1, wherein the second connecting position is located at the inner peripheral end of the spiral pattern.

7. The method for manufacturing the planar coil as claimed in claim 6, wherein the third connecting position is located at a cross point of an innermost turn of the spiral pattern and an extension line extending from the inner peripheral end in a winding direction.

8. The method for manufacturing the planar coil as claimed in claim 1, wherein the base material comprises a resin film.

9. The method for manufacturing the planar coil as claimed in claim 1, wherein each of the base conductive layer and the wiring conductive layer comprises at least one of metal selected from Cu, Ag, and Au, respectively.

10. The method for manufacturing the planar coil as claimed in claim 1, wherein only a single power-feed wiring portion is connected to the spiral pattern.

11. The method for manufacturing the planar coil as claimed in claim 1, wherein a width of the power-feed wiring portion is larger than a width of the spiral pattern.

12. The method for manufacturing the planar coil as claimed in claim 1, wherein a width of the connection wiring portion is larger than a width of the spiral pattern.

* * * * *

UNITED STATES PATENT AND TRADEMARK OFFICE
CERTIFICATE OF CORRECTION

PATENT NO.        : 10,354,796 B2
APPLICATION NO.   : 15/840243
DATED             : July 16, 2019
INVENTOR(S)       : Yuhei Horikawa et al.

It is certified that error appears in the above-identified patent and that said Letters Patent is hereby corrected as shown below:

On the Title Page

Item (30) insert:
--Foreign Application Priority Data
Dec 15, 2016[JP]         2016-243525--

Signed and Sealed this
Tenth Day of December, 2019

Andrei Iancu
*Director of the United States Patent and Trademark Office*